(12) United States Patent
Namkung et al.

(10) Patent No.: US 10,216,023 B2
(45) Date of Patent: Feb. 26, 2019

(54) FLEXIBLE DISPLAY DEVICE

(71) Applicant: Samsung Display Co., Ltd., Yongin, Gyeonggi-Do (KR)

(72) Inventors: Jun Namkung, Yongin (KR); Seong-Jun Lee, Yongin (KR)

(73) Assignee: Samsung Display Co., Ltd. (KR)

( * ) Notice: Subject to any disclaimer, the term of this patent is extended or adjusted under 35 U.S.C. 154(b) by 628 days.

(21) Appl. No.: 14/306,056

(22) Filed: Jun. 16, 2014

(65) Prior Publication Data

US 2015/0036299 A1 Feb. 5, 2015

(30) Foreign Application Priority Data

Jul. 31, 2013 (KR) ........................ 10-2013-0091095

(51) Int. Cl.
*H05K 1/02* (2006.01)
*G02F 1/1333* (2006.01)
(Continued)

(52) U.S. Cl.
CPC .. *G02F 1/133345* (2013.01); *G02F 1/133305* (2013.01); *H01L 51/5253* (2013.01); *H05K 1/0271* (2013.01); *G02F 2001/133311* (2013.01); *G02F 2001/133388* (2013.01); *G02F 2201/50* (2013.01); *H01L 27/3244* (2013.01); *H01L 27/3276* (2013.01); *H01L 2251/5338* (2013.01); *H01L 2251/566* (2013.01); *H05K 1/036* (2013.01); *H05K 1/0393* (2013.01); *H05K 3/0052* (2013.01); *H05K 3/28* (2013.01); *H05K 2201/0175* (2013.01); *H05K 2201/0179* (2013.01); *H05K 2201/0195* (2013.01);

(Continued)

(58) Field of Classification Search
CPC ......... G02F 1/133345; G02F 1/133305; G02F 2001/133311; G02F 2001/133388; G02F 2201/50; H01L 51/5253; H01L 27/3276; H01L 27/3244; H01L 2251/5338; H01L 2251/566; H05K 3/0052; H05K 2201/10136; H05K 1/036; H05K 2201/09036; H05K 2201/0195; H05K 2201/0179; H05K 3/28; H05K 1/0393; H05K 2201/0175; Y10T 428/10; Y10T 428/1036

See application file for complete search history.

(56) References Cited

U.S. PATENT DOCUMENTS

| | | | | |
|---|---|---|---|---|
| 2007/0241326 | A1* | 10/2007 | Kim | ............... H01L 51/5275 257/40 |
| 2011/0001146 | A1* | 1/2011 | Yamazaki | ............ H05B 33/04 257/79 |
| 2012/0318771 | A1* | 12/2012 | Guo | ............... G02F 1/133305 216/20 |

FOREIGN PATENT DOCUMENTS

| | | |
|---|---|---|
| KR | 10-2005-0082449 | 8/2005 |
| KR | 10-2010-0090887 | 8/2010 |

(Continued)

*Primary Examiner* — Anthony J Frost
(74) *Attorney, Agent, or Firm* — Innovation Counsel LLP

(57) ABSTRACT

A flexible display device that can suppress spread of cracks of an inorganic layer is provided. A flexible display device includes a flexible substrate including a display area and a periphery surrounding the display area, an inorganic layer formed on the flexible substrate, a display unit formed on the display area, and a thin film encapsulation layer covering the display unit. The inorganic layer includes an opening disposed on a periphery between edges of the flexible substrate and the thin film encapsulation layer.

19 Claims, 9 Drawing Sheets

(51) Int. Cl.
*H01L 51/52* (2006.01)
*H05K 1/03* (2006.01)
*H05K 3/00* (2006.01)
*H05K 3/28* (2006.01)
*H01L 27/32* (2006.01)

(52) U.S. Cl.
CPC .............. *H05K 2201/09036* (2013.01); *H05K 2201/10136* (2013.01); *Y10T 428/10* (2015.01); *Y10T 428/1036* (2015.01)

(56) References Cited

FOREIGN PATENT DOCUMENTS

| | | |
|---|---|---|
| KR | 10-2010-0090888 | 8/2010 |
| KR | 10-2011-0017715 | 2/2011 |
| KR | 10-2011-0092062 | 8/2011 |
| KR | 10-2012-0074744 | 7/2012 |
| KR | 10-2013-0072808 | 7/2013 |

* cited by examiner

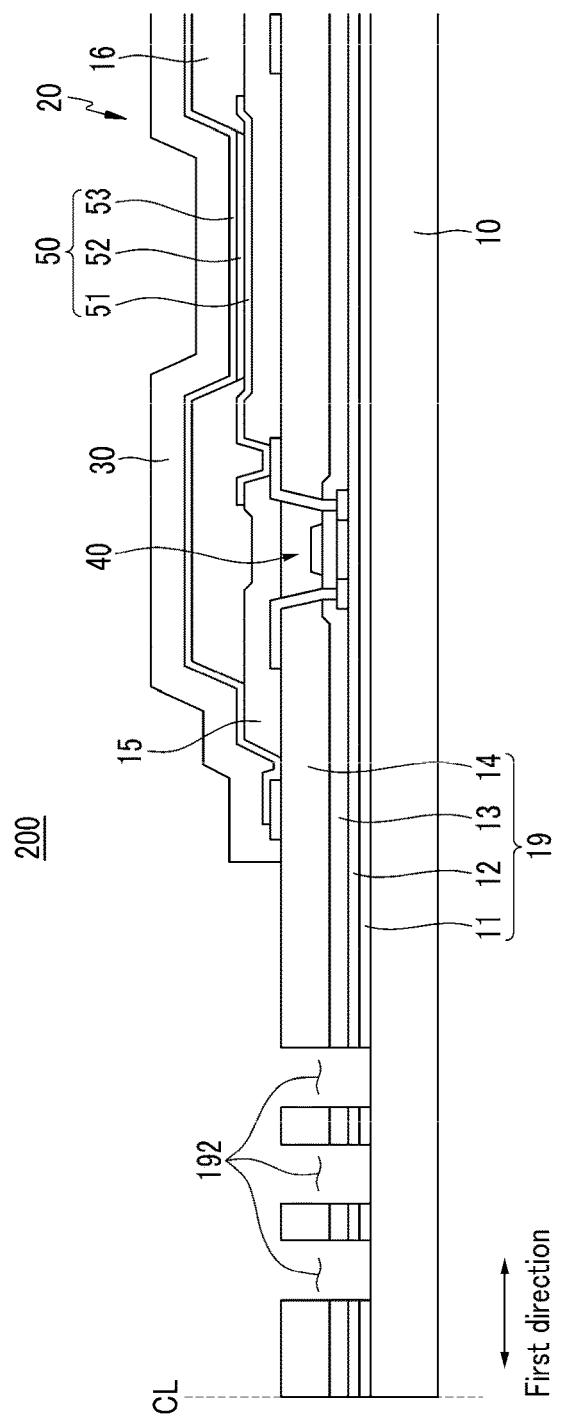

FLEXIBLE DISPLAY DEVICE

CROSS-REFERENCE TO RELATED APPLICATION

This application claims priority to and the benefit of Korean Patent Application No. 10-2013-0091095 filed in the Korean Intellectual Property Office on Jul. 31, 2013, the entire contents of which are incorporated herein by reference.

BACKGROUND

1. Field

Example embodiments relate to a flexible display. More particularly, example embodiments relate to a flexible display manufactured by scribing a flexible mother board into predetermined number of panels.

2. Description of the Related Art

A flat panel display includes a substrate and a display unit including a plurality of pixels formed on the substrate. The flat panel display may have a bending characteristic when the substrate is formed of a flexible material like a plastic film instead of a rigid material like glass. The flexible display device may be a liquid crystal display (LCD) or a self-emissive organic light emitting diode (OLED) display.

The flexible display device is manufactured through a process in which a plurality of display units and a plurality of thin film encapsulation layers are formed on a mother board, an upper protection film and a lower protection film are layered in the flexible mother board, and the mother board is separated to individual flexible display devices by cutting scribe lines between individual flexible display devices. The upper protection film, the lower protection film, and the flexible mother board are cut by putting strong pressure on the mother board using a cutting knife.

The strong pressure is applied as an impact to the flexible display device and, at the same time, a bending force is applied to the flexible display device during a cutting process. Thus, inorganic layers (such as a barrier layer, a buffer layer, and various insulating layers) close to the scribe lines are damaged, thereby causing cracks. The cracks generated in the inorganic layer are spread toward a thin film encapsulation layer during a post-process after the cutting, thereby causing panel shrinkage due to a loss of an encapsulation function of the thin film encapsulation layer.

The above information disclosed in this Background section is only for enhancement of understanding of the background of the invention and therefore it may contain information that does not form a prior art.

SUMMARY

Example embodiments have been made in an effort to provide a flexible display device that can prevent a failure such as panel shrinkage by blocking spread of cracks generated during a cutting process to a thin film encapsulation layer.

A flexible display device according to an exemplary embodiment includes a flexible substrate including a display area and a periphery surrounding the display area, an inorganic layer formed on the flexible substrate, a display unit formed on the display area and a thin film encapsulation layer covering the display unit. The inorganic layer includes an opening disposed on a periphery between edges of the flexible substrate and the thin film encapsulation layer.

The opening may extend along the edges of the flexible substrate.

The opening in which a pad area exists may include a plurality of opening patterns disposed between pad electrodes.

A blocking layer may be formed by filling an organic material in the opening, the organic material comprising at least one of a urethane-based resin, an epoxy-based resin, and an acryl-based resin.

The opening may be formed at about 100 μm to 500 μm from the edges of the flexible substrate.

A width of the opening is about 20 μm to about 200 μm.

The opening may include a plurality of openings extending along a second direction and substantially parallel to each other.

The opening may include a plurality of openings arranged along a second direction that is parallel with the edges of the flexible substrate.

The plurality of openings may be arranged to form at least two rows arranged along the second direction, and gaps between the openings in a first row and a second row are not in a same line substantially perpendicular to the edges of the flexible substrate.

The gaps between the openings in a first row and a second row may be smaller than a gap between the openings in a first row and the second row.

The inorganic layer may include a plurality of openings disposed along a second direction.

The width of each of the plurality of openings along the second direction may be greater than a distance between the plurality of openings.

According to the present exemplary embodiment, the opening is formed in the inorganic layer of the flexible display device so that spread of cracks toward the thin film encapsulation can be blocked, thereby improving production yield by suppressing panel shrinkage and display failure.

BRIEF DESCRIPTION OF THE DRAWINGS

FIG. 4 is a partially enlarged cross-sectional view of a flexible display according to a second exemplary embodiment.

DETAILED DESCRIPTION

Embodiments of the inventive concept will be described more fully hereinafter with reference to the accompanying drawings, in which exemplary embodiments of the inventive concert are shown. As those skilled in the art would realize, the described embodiments may be modified in various different ways, all without departing from the spirit or scope of the inventive concept.

In the specification, unless explicitly described to the contrary, the word "comprise" and variations such as "comprises" or "comprising" will be understood to imply the inclusion of stated elements but not the exclusion of any other elements which is not stated. In addition, it will be understood that when an element such as a layer, film, region, or substrate is referred to as being "on" another element, it can be directly on the other element or it may be disposed on the layer, film, region, or substrate with intervening elements. In contrast, when an element is referred to as being "directly on" another element, there are no intervening elements present. Further, in the specification, the word "on" means positioning on or below the object portion, and does not essentially mean positioning on the upper side of the object portion based on a gravity direction.

Figure 1:
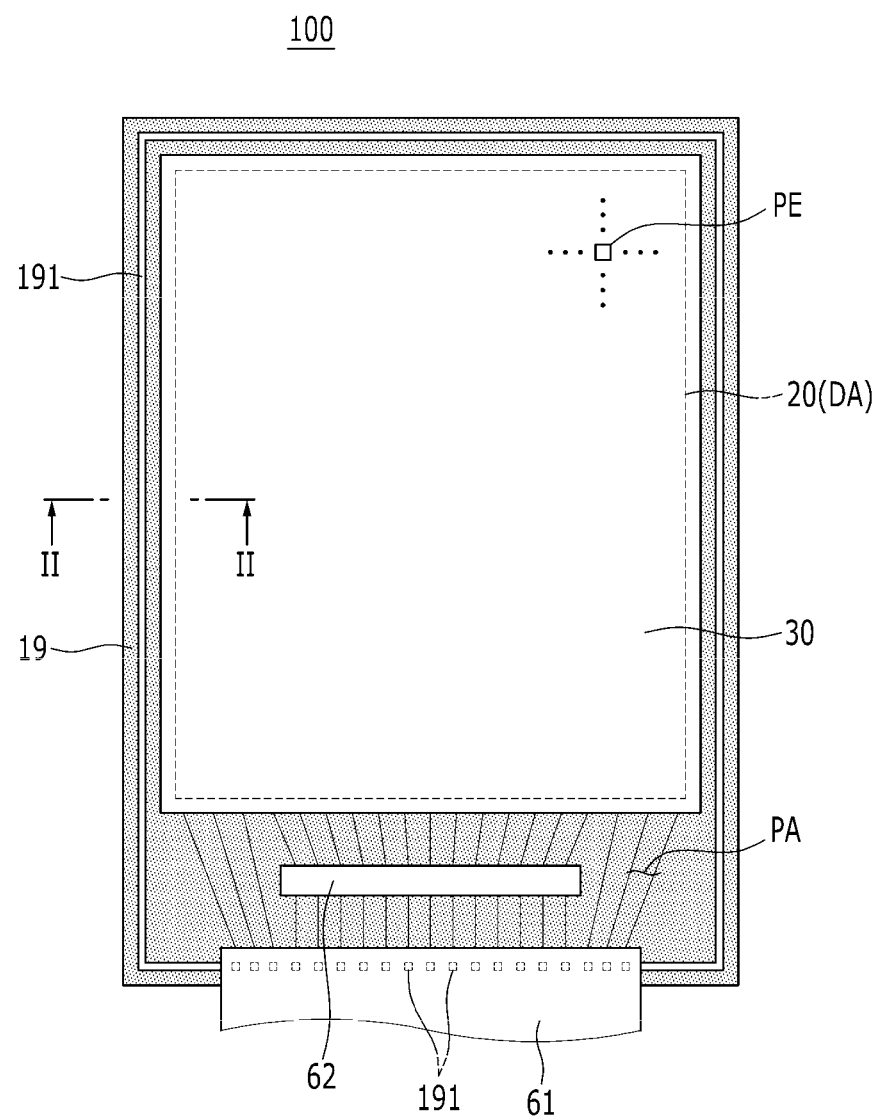
FIG. 1 is a plan view of a flexible display according to a first exemplary embodiment.
Figure 2:
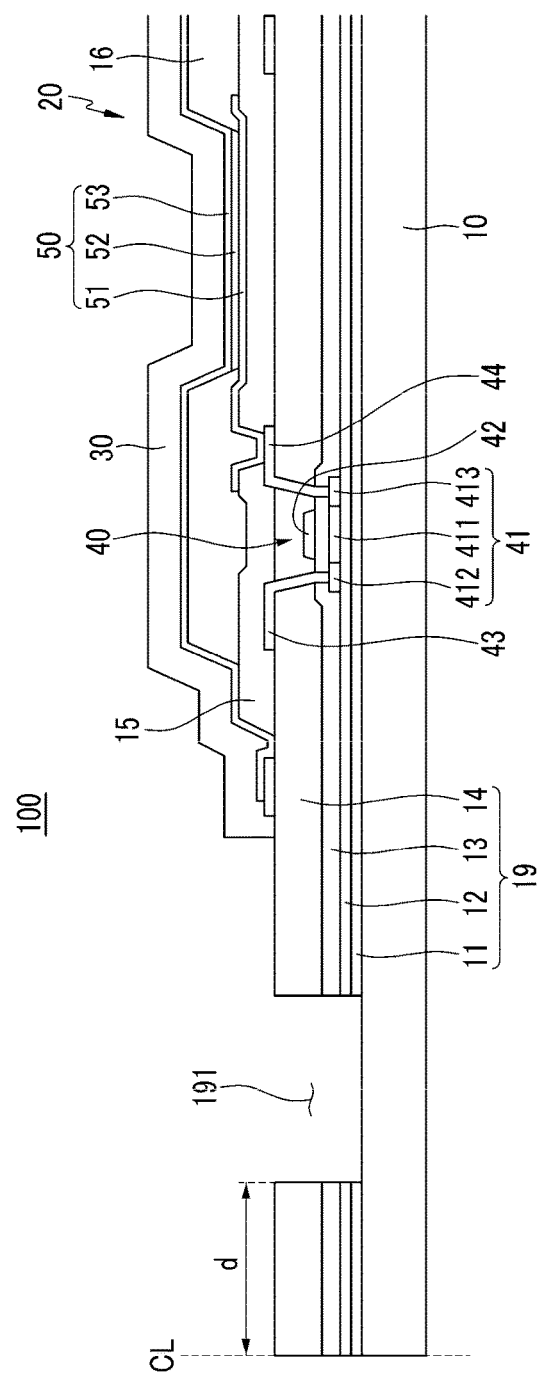
FIG. 2 is a partial cross-sectional view of FIG. 1, taken along the line II-II.

FIG. 1 is a plan view of a flexible display according to a first exemplary embodiment, and FIG. 2 is a partial cross-sectional view of FIG. 1 taken along the line II-II.

Referring to FIG. 1 and FIG. 2, a flexible display 100 according to the first exemplary embodiment includes a flexible substrate 10, a display unit 20 formed on the flexible substrate 10, and a thin film encapsulation layer 30 formed on the display unit 20. The display unit 20 is provided with a plurality of pixels PE, and displays an image with a combination of lights emitted from the plurality of pixels PE. Each pixel PE is formed of a pixel circuit, and a liquid crystal display or an organic light emitting diode 50 of which light emission is controlled by the pixel circuit.

The flexible substrate 10 may be formed of a plastic film such as polyimide or polycarbonate. However, because the plastic film has a higher moisture transmission rate and higher oxygen transmittance than a glass which is a typical substrate material for non-flexible display, transmittance of external moisture and oxygen through the flexible substrate 10 should be blocked. Thus, a barrier layer 11 and a buffer layer 12 may be formed on the flexible substrate 10.

The barrier layer 11 is formed of a plurality of inorganic layers, and for example, a silicon oxide layer and a silicon nitride layer may be alternately and repeatedly stacked. Because the barrier layer 11 has a lower moisture transmission rate and lower oxygen transmittance than the flexible substrate 10 that is formed of the plastic film, moisture and oxygen transmitted through the flexible substrate 10 can be suppressed from permeating into the display unit 20.

The buffer layer 12 is also formed of an inorganic layer, and for example may include a silicon oxide or a silicon nitride. The buffer layer 12 provides a flat surface for forming the pixel circuit, and suppresses permeation of moisture and foreign particles into the pixel circuit and the organic light emitting diode 50.

One of the barrier layer 11 or the buffer layer 12 may not be formed.

A thin film transistor 40 and a capacitor (not shown) are formed on the buffer layer 12. The thin film transistor 40 includes a semiconductor layer 41, a gate electrode 42, and source/drain electrodes 43 and 44.

The semiconductor layer 41 may be formed of a polysilicon or oxide semiconductor, and includes a channel area 411 in which impurities are not doped and a source area 412 and a drain area 413 in which impurities are doped. The source area 412 and the drain area 413 may be disposed at respective sides of the channel area. When the semiconductor layer 41 is formed of the oxide semiconductor, an additional protective layer for protecting the semiconductor layer 41 may be formed.

A gate insulating layer 13 is formed between the semiconductor layer 41 and the gate electrode 42, and an interlayer insulating layer 14 is formed between the gate electrode 42 and the source/drain electrodes 43 and 44. The gate insulating layer 13 and the interlayer insulating layer 14 may be formed of inorganic layers.

The thin film transistor 40 shown in FIG. 2 is a driving thin film transistor for OLED device, and the pixel circuit may further includes a switching thin film transistor (not shown). The switching thin film transistor is used as a switching element that selects a pixel for light emission, and the driving thin film transistor applies power for light emission to the selected pixel. The thin film transistor 40 may be a switching thin film transistor for the liquid crystal display.

In FIG. 2, the thin film transistor 40 has a top gate structure, but the structure of the thin film transistor 40 is not limited thereto. In addition, the pixel circuit may be provided with three or more thin film transistors and two or more capacitors.

A planarization layer 15 is formed on the source and drain electrodes 43 and 44. The planarization layer 15 may be formed of an organic insulation material or an inorganic insulation material, or may be formed of a combination of the organic insulation material and the inorganic insulation material. As the organic insulation material, an acryl-based resin, an epoxy-based resin, a phenol-based resin, a polyamide-based resin, and the like may be used. The planarization layer 15 includes a via hole that exposes the drain electrode 44, and the organic light emitting diode 50 is formed on the planarization layer 15.

The organic light emitting diode 50 includes a pixel electrode 51, an organic emission layer 52, and a common electrode 53. The pixel electrode 51 is formed in each pixel, and is connected with the drain electrode 44 of the thin film transistor 40 through the via hole. The common electrode 53 is formed throughout a display area DA of the flexible substrate 10. The pixel electrode 51 is surrounded by a pixel defining layer 16 that partitions pixel areas, and the organic emission layer 52 is formed on the exposed pixel electrode 51.

The emission layer 52 may be one of a red emission layer, a green emission layer, and a blue emission layer. Alternatively, the organic emission layer 52 may emit white light. The organic emission layer 52 emitting the white light may be formed of a single white emission layer, or may be formed in a multi-layered structure of a red emission layer, a green emission layer, and a blue emission layer. When the organic emission layer 52 emits the white light, a color filter (not shown) may further be included in the OLED device.

One of the pixel electrode 51 and the common electrode 53 is a hole injection electrode (i.e., anode) and the other is an electron injection electrode (i.e., cathode). Holes injected from the anode and electrons injected from the cathode are combined in the organic emission layer 52 to generate excitons, and light is emitted while the excitons discharge energy.

At least one of the hole injection layer and a hole transport layer may be provided between the anode and the organic emission layer 52, and at least one of the electron injection layer and an electron transport layer may be provided between the organic emission layer 52 and the cathode. The hole injection layer, the hole transport layer, the electron transport layer, and the electron injection layer may be formed over the entire display area DA of the flexible substrate 10.

One of the pixel electrode 51 and the common electrode 53 may be formed of a metal reflective layer and the other may be formed of a semi-transmissive or transparent conductive layer. Light emitted from the organic emission layer 52 is reflected by the metal reflective layer and emitted to the outside through the transparent conductive layer. In case of the semi-transmissive layer, light emitted from the organic emission layer 52 is partially reflected to the metal reflective layer again such that a resonance structure is formed.

The thin film encapsulation layer 30 protects the organic light emitting diode 50 from the external environment that contains moisture and oxygen to suppress deterioration of the organic light emitting diode 70 due to moisture and oxygen. The thin film encapsulation layer 30 may be formed of a multi-layered structure in which a plurality of organic layers and a plurality of inorganic layers are alternately stacked one by one.

The plurality of organic layers of the thin film encapsulation layer 30 may be formed of a polymer, for example, polyethylene terephthalate, polyimide, polycarbonate, epoxy, polyethylene, and polyacrylate. The plurality of inorganic layer of the thin film encapsulating layer 30 may be an oxide, a nitride or oxynitride. For example, the inorganic layer may contain any one of $SiNx$, $Al_2O_3$, $S_iO_2$, AZO, ZnO, ZrO, $TiO_2$ and SiON.

The flexible substrate 10 includes a display area DA where the display unit 20 and the thin film encapsulation layer 30 are disposed, and a pad area PA at an exterior side of the thin film encapsulation layer 30. Pad electrodes (not shown) connected with the pixel circuit are disposed in the pad area PA, and the pad electrodes are electrically connected with a chip on film 61 attached to the pad area PA or a flexible printed circuit board. In FIG. 1, reference numeral 62 denotes an integrated circuit chip disposed on the pad area PA.

In the flexible display device 100, an inorganic layer 19 includes at least one of the barrier layer 11, the buffer layer 12, the gate insulating layer 13, and the interlayer insulating layer 14, and is formed over the top surface of the flexible substrate 10. In addition, the thin film encapsulation layer 30 is not formed on a periphery of the flexible substrate 10 such that the inorganic layer 19 is exposed to the outside of the thin film encapsulation layer 30. The thin film encapsulation layer 30 may be disposed on an inner side of the flexible substrate 10 with a gap of about 600 μm to about 700 μm from the edge of the flexible substrate 10.

Figure 3:
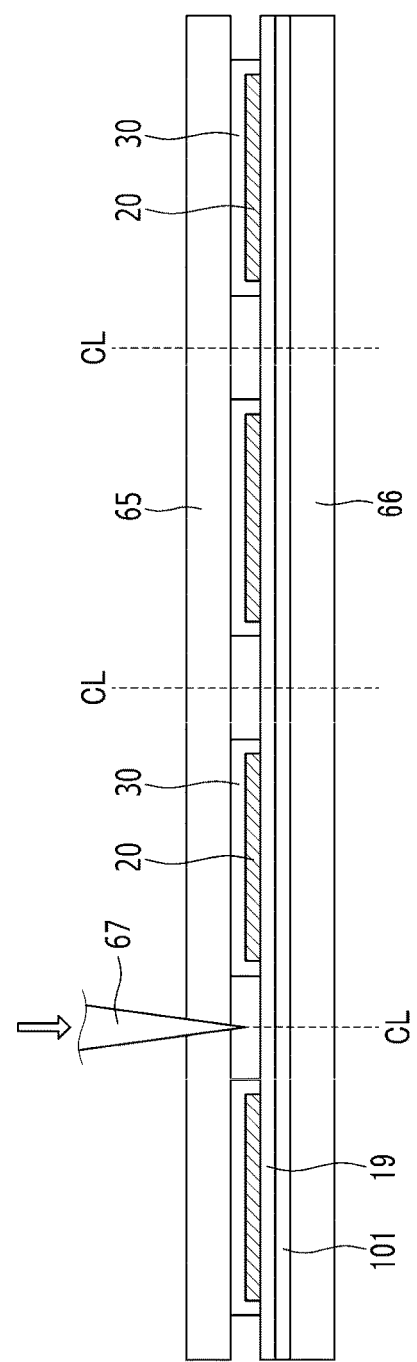
FIG. 3 is a schematic cross-sectional view provided for description of a manufacturing method of the flexible display.

FIG. 3 is a schematic cross-sectional view provided for description of a manufacturing method of the flexible display device.

Referring to FIG. 3, the flexible display device may be manufactured through a process in which a plurality of display units 20 and a plurality of thin film encapsulation layers 30 are formed on a flexible mother board 101, an upper protection film 65 and a lower protection film 66 are attached to the flexible mother board 101, the flexible mother board 101 is cut into individual flexible display devices by cutting between the plurality of thin film encapsulation layers 30 ("Scribe Line"), and the upper protection film 65 and the lower protection film 66 are removed from the separated flexible display devices.

The upper protection film 65 and the lower protection film 66 may be formed of at least one layer of a plastic film and an adhesive layer.

When cutting the flexible mother board 101, a wheel cutting method and a laser cutting method used to cut a rigid substrate such as glass may not be applied. In case of the wheel cutting method, the upper protection film 65 and the lower protection film 66 may be torn during the cutting process, and in case of the laser cutting method, the organic light emitting diode is deteriorated due to heat from laser irradiation. Therefore, the flexible mother board 101 may be cut through a press method using a cutting knife 67.

However, because a cutting force of about 5 tons to about 15 tons is directly applied as an impact to the flexible mother board 101, stress is concentrated to the inorganic layer 19 disposed adjacent to a cutting line CL. In addition, because the cutting knife 67 penetrates the upper protection film 65 and directly cuts the inorganic layer 19, and a bending stress is generated from the flexible mother board 101. Accordingly, the inorganic layer 19 disposed adjacent to the cutting line CL is damaged, thereby causing cracks.

Referring to FIG. 1 to FIG. 3, the inorganic layer 19 in the flexible display device 100 according to the present exemplary embodiment includes an opening 191 that suppresses spread of cracks into an inner side of the flexible display 100 to the thin film encapsulation film 30. The opening 191 may be provided between the edge of the flexible substrate 10 and the thin film encapsulation layer 30. The opening 191 prevents cracks generated during the cutting process from being spread and transmitted to the thin film encapsulation layer 30 and the display unit 30 in an inner side of the flexible display 10 through the inorganic layer 19.

Although the flexible display device 100 according to the present exemplary embodiment cannot suppress generation of cracks during the cutting process, spread and transmission of the cracks toward the thin film encapsulation layer 30 during a post-process is suppressed by using the opening 191. Therefore, panel shrinkage and display failure due to spread of the cracks can be prevented.

The opening 191 of the inorganic layer 19 may be formed using a method such as etching and the like. In addition, the opening 191 may extend along a three edge of the flexible substrate 10 between the edge of the flexible substrate 10 and the thin film encapsulation layer 30 excluding one edge in which the pad area PA exists.

Pad electrodes are disposed in the pad area PA and the inorganic layer 19 insulates between the pad electrodes. In the pad area PA, the opening 191 is formed with a plurality of openings disposed between the pad electrodes so as to prevent spread of the cracks and at the same time insulate between pad electrodes.

The opening 191 of the inorganic layer 19 may be formed at about 100 μm to about 500 μm from the edge of the flexible display 100. In FIG. 2, a distance between the edge of the flexible display 100 and the opening 191 is denoted as d.

When the distance d between the edge of the flexible display 100 and the opening 191 is less than 100 μm, the cracks may spread over the opening 191 during the cutting process, and when the distance d between the edge of the flexible display 100 and the opening 191 exceeds 500 μm, the cracks may spread to the thin film encapsulation layer 30 through the inorganic layer included in the thin film encapsulation layer 30. The opening 191 may have a width of about 20 μm to 200 μm.

In FIG. 2, the inorganic layer 19 includes the barrier layer 11, the buffer layer 12, the gate insulating layer 13, and the interlayer insulating layer 14, but the inorganic layer 19 may include only one of the layers or two or three of the layers.

The inorganic layer 19 according to the embodiment of the inventive concept may be partially removed. For example, only the interlayer insulating layer 14, only the interlayer insulating layer 14 and the gate insulating layer 13, or only the interlayer insulating layer 14. The gate insulating layer 13 and the buffer layer may be selectively removed.

As described, the flexible display 100 of the present exemplary embodiment can prevent spread of the cracks toward the thin film encapsulation layer 30 by forming the opening 191 in the inorganic layer 19, and accordingly, panel shrinkage and display failure can be suppressed, thereby improving production yield.

FIG. 4 is a partially enlarged cross-sectional view of a flexible display device according to a second exemplary embodiment.

Referring to FIG. 4, a flexible display device 200 according to the second exemplary embodiment is the same as the flexible display device of the first exemplary embodiment, except that a plurality of openings 192 of an inorganic layer 19 are formed along a first direction. The same reference numerals are used for the same components as those of the first exemplary embodiment.

The first direction is a direction that faces toward a display unit 20 from the edge of a flexible substrate 10.

Each opening 192 is formed at a different distance from the edge of the flexible substrate 10. In FIG. 4, three openings 192 are formed, but the number of openings 192 is not limited thereto.

Because the plurality of openings 192 are formed along a crack spread path in the second exemplary embodiment, the spread of the cracks can be blocked more efficiently.

Figure 5A:
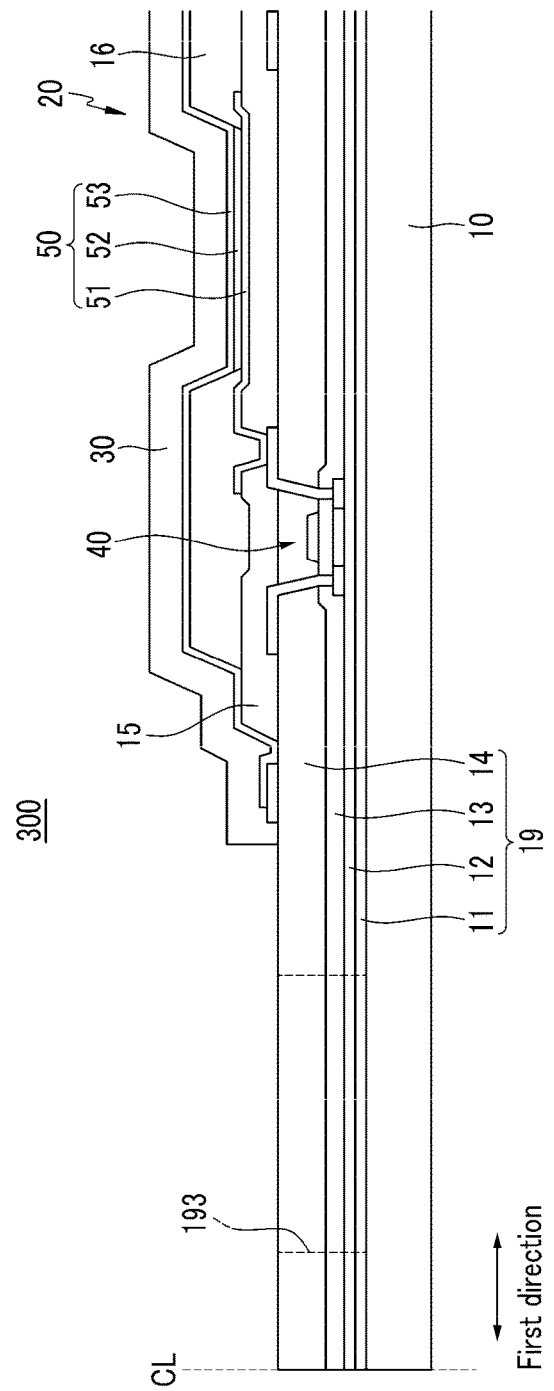
FIG. 5A is a partially enlarged cross-sectional view of a flexible display according to a third exemplary embodiment.
Figure 5B:
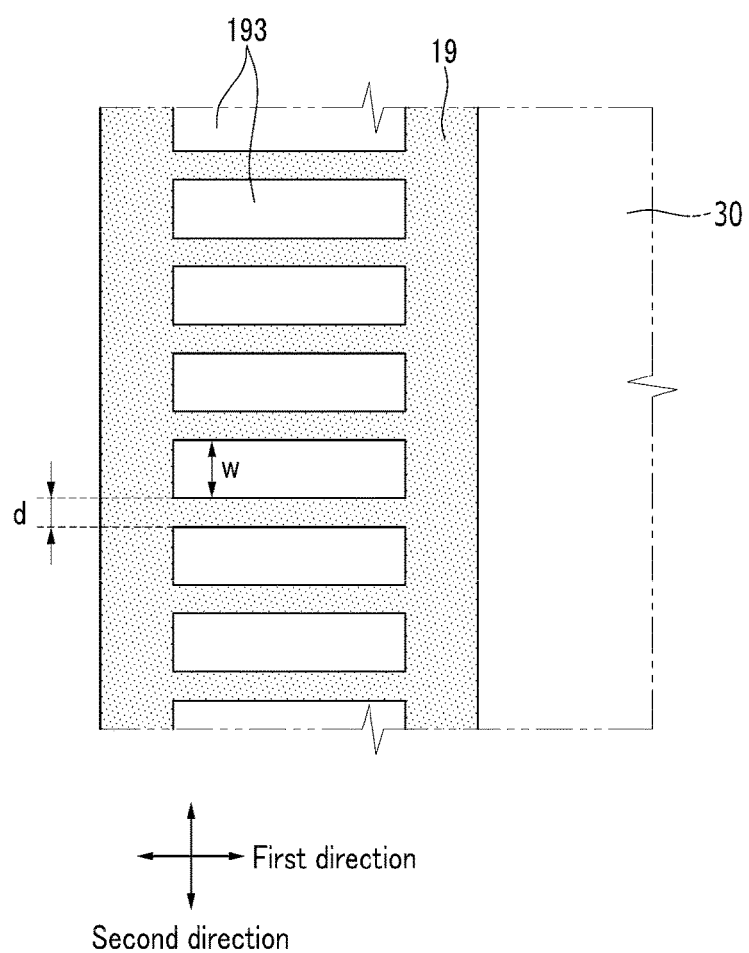
FIG. 5B is a plan view of FIG. 5A.

FIG. 5A is a partially enlarged cross-sectional view of a flexible display device according to a third exemplary embodiment, and FIG. 5B is a top plan view of FIG. 5A.

Referring to FIG. 5A and FIG. 5B, a flexible display device 300 according to the third exemplary embodiment is the same as the flexible display device of the first exemplary embodiment, except that a plurality of openings 193 are formed along a second direction. The same reference numerals are used for the same components as those of the first exemplary embodiment.

The second direction is a direction that is parallel with the edge of a flexible substrate 10. A width w of each of the plurality of openings 193 is greater than a distance d between the openings 193. Therefore, the area of the inorganic layer 19 occupying along a crack spread direction toward the display unit 20 from the edge of the flexible substrate 10 can be significantly reduced, and accordingly the spread of cracks through the inorganic layer 19 can be suppressed.

Figure 6A:
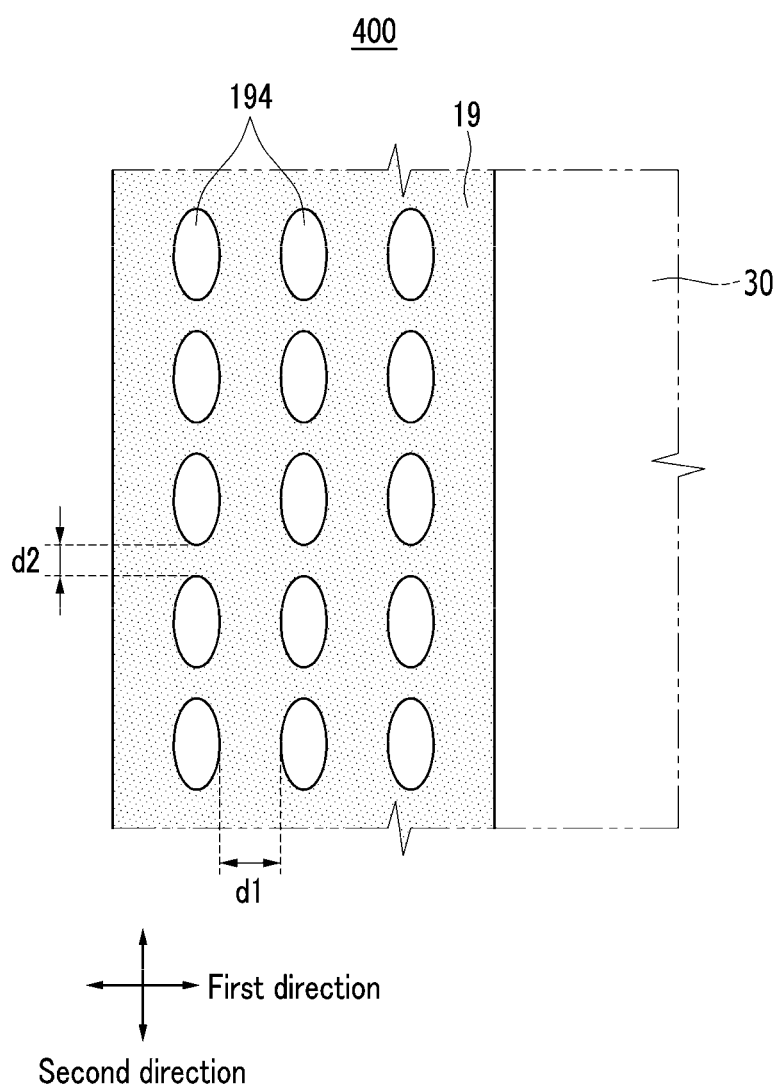
FIG. 6A-FIG. 6B is a partial plan view of a flexible display according to a fourth exemplary embodiment.

FIG. 6A is a partial top plan view of a flexible display device according to a fourth exemplary embodiment.

Referring to FIG. 6A, a flexible display device 400 according to the fourth exemplary embodiment is the same as the flexible display device of the first exemplary embodiment, except that a plurality of openings 194 are formed along first and second directions of an inorganic layer 19. The same reference numerals are used for the same components as those of the first exemplary embodiment.

The first direction is a direction that faces toward a display unit from the edge of a flexible substrate, and the second direction is a direction that is parallel with the edge of the flexible substrate. A distance d1 between the openings 194 along the first direction is greater than a distance d2 between the openings 194 along the second direction. In this case, spread cracks of the inorganic layer 19 can be introduced to a direction where the openings 194 have narrow distances, that is, the second direction, and accordingly the spread of the cracks in the first direction can be suppressed.

Figure 6B:
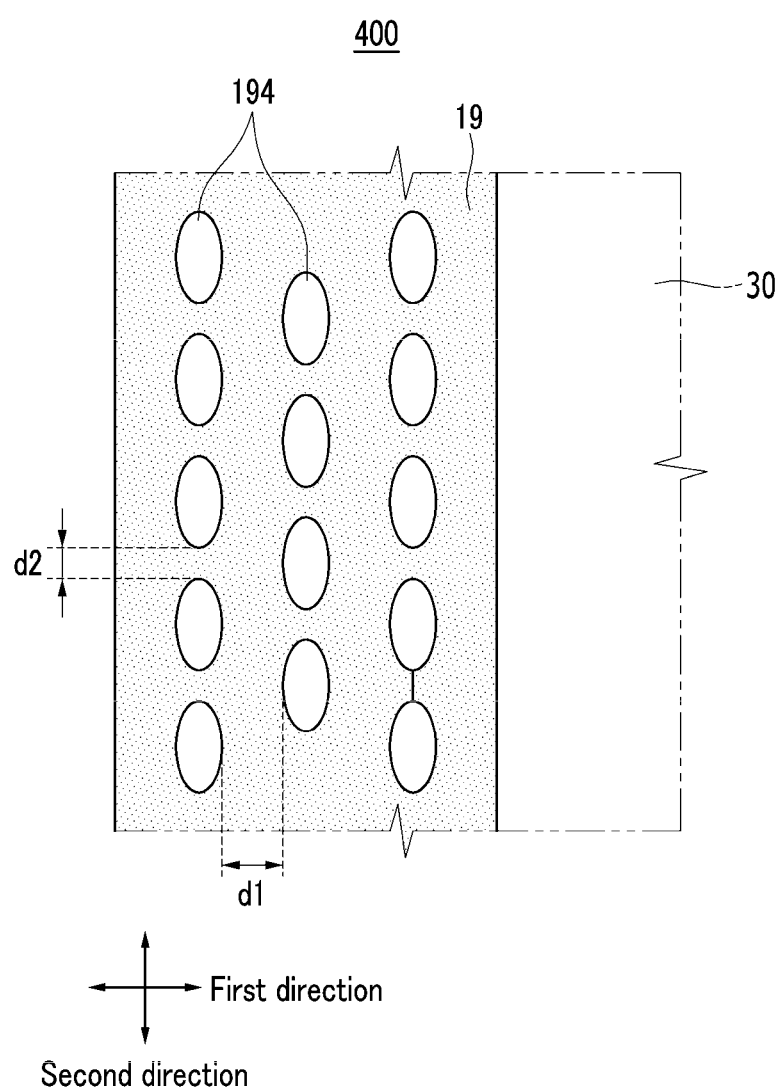

In FIG. 6A, each opening 194 is formed in the shape of a rectangular shape or an oval shape that extends in the second direction, but the shapes of the openings are not limited thereto. The openings may be arranged to form at least two rows extending along the second direction as shown in FIG. 6B. Gaps between the openings 194 in a first row and a second row may not be in a same line extending substantially perpendicular to the edges of the flexible substrate. Thus, the gaps in the first row are covered by the openings in the second row. Thus, the crack generated during the cutting process is prevented from spread into the inner side of the flexible display 100 to the thin film encapsulation film 30.

Figure 7:
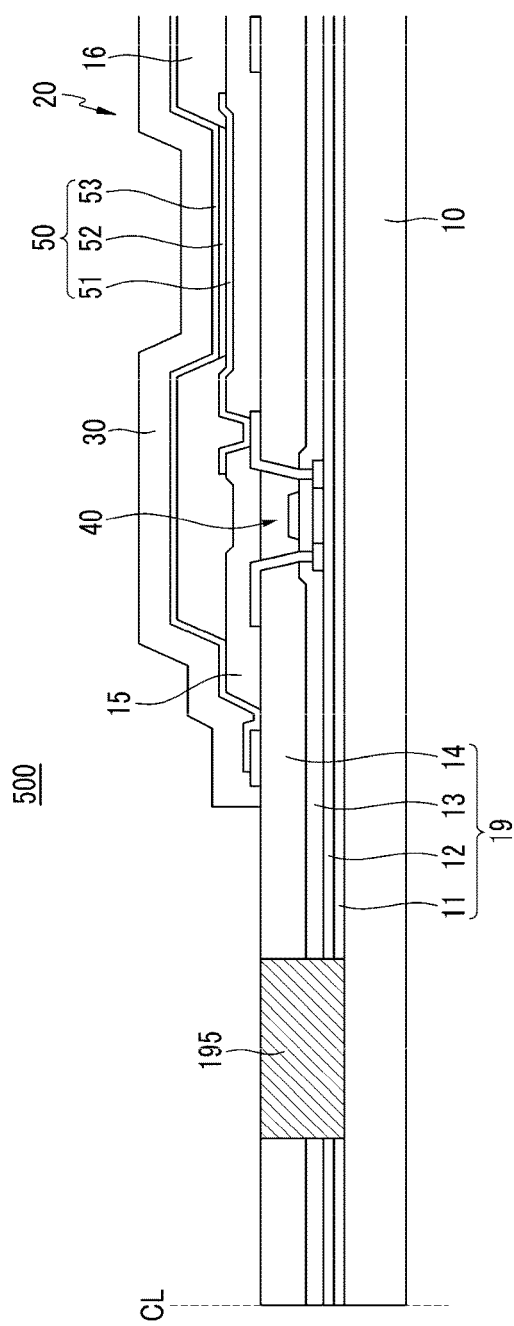
FIG. 7 is a partially enlarged cross-sectional view of a flexible display according to a fifth exemplary embodiment.

FIG. 7 is a partially enlarged cross-sectional view of a flexible display device according to a fifth exemplary embodiment.

Referring to FIG. 7, a flexible display device 500 according to the fifth exemplary embodiment is the same as the flexible display devices of the first to fourth exemplary embodiments, except that a blocking layer 195 is formed by filling an organic material in an opening of an inorganic layer 19.

The blocking layer 195 may include at least one of a urethane-based resin, an epoxy-based resin, and an acryl-based resin. Like the above-stated opening, the blocking layer 195 prevents spread and transmission of cracks generated from the edge of the inorganic layer 19 during a cutting process toward a thin film encapsulation layer 30.

The inorganic layers 19 of the second exemplary embodiment to the fifth exemplary embodiment may respectively include barrier layers 11, buffer layers 12, gate insulating layers 13, and interlayer insulating layers 14, or may respectively include only one of the layers, or may include two or three of the layers.

While this inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

What is claimed is:

1. A flexible display device comprising:
   a flexible substrate including a display area and a periphery surrounding the display area;
   an inorganic layer disposed on the flexible substrate;
   a display unit disposed on the display area and comprising an organic light emitting diode, the organic light emitting diode comprising a pixel electrode, an organic emission layer and a common electrode;
   a pixel defining layer disposed on the pixel electrode, the pixel defining layer exposing a top surface of the pixel electrode; and
   a thin film encapsulation layer disposed on and directly contacting the common electrode,
   wherein the inorganic layer includes an opening disposed on the periphery, the thin film encapsulation layer does not overlap the opening and overlaps an emitting region of the organic emission layer and the organic light emitting diode is disposed on the inorganic layer.

2. The flexible display device of claim 1, wherein the inorganic layer comprises at least one of a barrier layer, a buffer layer, a gate insulating layer, and an interlayer insulating layer.

3. The flexible display device of claim 2, wherein the opening extends along the edges of the flexible substrate.

4. The flexible display device of claim 3, wherein the opening in which a pad area exists includes a plurality of opening patterns disposed between pad electrodes.

5. The flexible display device of claim 4, wherein a blocking layer is formed by filling an organic material in the opening, the organic material comprising at least one of a urethane-based resin, an epoxy-based resin, and an acryl-based resin.

6. The flexible display device of claim 3, wherein the opening is disposed at about 100 μm to 500 μm from the edge of the flexible display.

7. The flexible display device of claim 6, wherein a width of the opening is about 20 μm to about 200 μm.

8. The flexible display device of claim 7, wherein a blocking layer is formed by filling an organic material in the opening, the organic material comprising at least one of a urethane-based resin, an epoxy-based resin, and an acryl-based resin.

9. The flexible display device of claim 3, wherein the opening includes a plurality of openings extending along a second direction and substantially parallel to each other.

10. The flexible display device of any one of claim 9, wherein a blocking layer is formed by filling an organic material in the opening, the organic material comprising at least one of a urethane-based resin, an epoxy-based resin, and an acryl-based resin.

11. The flexible display device of claim 3, wherein the opening includes a plurality of openings arranged along a second direction that is parallel with the edges of the flexible substrate.

12. The flexible display device of any one of claim 11, wherein a blocking layer is formed by filling an organic material in the opening, the organic material comprising at least one of a urethane-based resin, an epoxy-based resin, and an acryl-based resin.

13. The flexible display device of claim 11, wherein the plurality of openings are arranged to form at least two rows arranged along the second direction, and gaps between the openings in a first row and a second row are not in a same line substantially perpendicular to the edges of the flexible substrate.

14. The flexible display device of any one of claim 13, wherein a blocking layer is formed by filling an organic material in the opening, the organic material comprising at least one of a urethane-based resin, an epoxy-based resin, and an acryl-based resin.

15. The flexible display device of claim 3, wherein the inorganic layer includes a plurality of openings disposed along a second direction.

16. The flexible display device of claim 15, wherein the width of each of the plurality of openings along the second direction is greater than a distance between the plurality of openings.

17. The flexible display device of claim 16, wherein a blocking layer is formed by filling an organic material in the opening, the organic material comprising at least one of a urethane-based resin, an epoxy-based resin, and an acryl-based resin.

18. The flexible display device of any one of claim 2, wherein a blocking layer is formed by filling an organic material in the opening, the organic material comprising at least one of a urethane-based resin, an epoxy-based resin, and an acryl-based resin.

19. The flexible display device of any one of claim 1, wherein a blocking layer is formed by filling an organic material in the opening, the organic material comprising at least one of a urethane-based resin, an epoxy-based resin, and an acryl-based resin.

* * * * *